US008906778B2

(12) United States Patent
Wu et al.

(10) Patent No.: US 8,906,778 B2
(45) Date of Patent: Dec. 9, 2014

(54) METHOD OF SEMICONDUCTOR MANUFACTURING PROCESS

(75) Inventors: YewChung Sermon Wu, Hsinchu (TW); Bau-Ming Wang, Hsinchu (TW); Feng-Ching Hsiao, Hsinchu (TW)

(73) Assignee: National Chiao Tung University (TW)

( * ) Notice: Subject to any disclaimer, the term of this patent is extended or adjusted under 35 U.S.C. 154(b) by 599 days.

(21) Appl. No.: 13/163,378

(22) Filed: Jun. 17, 2011

(65) Prior Publication Data

US 2012/0231614 A1 Sep. 13, 2012

(30) Foreign Application Priority Data

Mar. 8, 2011 (TW) .............................. 100107823 A

(51) Int. Cl.
*H01L 21/30* (2006.01)
*H01L 21/46* (2006.01)
*H01L 21/02* (2006.01)
*H01L 21/18* (2006.01)
*H01L 33/00* (2010.01)

(52) U.S. Cl.
CPC ...... *H01L 21/02658* (2013.01); *H01L 21/0237* (2013.01); *H01L 21/02458* (2013.01); *H01L 21/0254* (2013.01); *H01L 21/02664* (2013.01); *H01L 21/02639* (2013.01); *H01L 21/187* (2013.01); *H01L 33/0079* (2013.01)
USPC .................... 438/458; 438/459; 257/E21.122

(58) Field of Classification Search
CPC .................... H01L 21/02293; H01L 21/0237; H01L 21/02458; H01L 21/0254; H01L 21/02664; H01L 21/02667; H01L 21/02669; H01L 21/02672; H01L 21/02694; H01L 21/02639; H01L 21/187; H01L 33/0079; H01L 21/20; H01L 21/2022; H01L 21/36
USPC .................. 438/455, 459, 488–502, 795; 257/E21.09, E21.091, E21.094, 257/E21.122, E21.328, E21.567
See application file for complete search history.

(56) References Cited

U.S. PATENT DOCUMENTS

| 6,855,620 | B2* | 2/2005 | Koike et al. .................... 438/481 |
| 2002/0068419 | A1* | 6/2002 | Sakaguchi et al. ............ 438/458 |
| 2007/0087485 | A1* | 4/2007 | Wu et al. ........................ 438/149 |
| 2009/0061636 | A1* | 3/2009 | Lee et al. ....................... 438/703 |
| 2010/0081256 | A1* | 4/2010 | Uemura et al. ................ 438/462 |

FOREIGN PATENT DOCUMENTS

| JP | 2004119807 A | 4/2004 |
| JP | 2005064247 A | 3/2005 |
| JP | 2007099567 A | 4/2007 |
| KR | 20080100466 A | 11/2008 |
| KR | 20110021565 A | 3/2011 |
| TW | 200842967 A | 11/2008 |
| TW | 200917426 A | 4/2009 |
| TW | 201027602 A | 7/2010 |

OTHER PUBLICATIONS

Taiwanese Office Action, Taiwan Patent Application No. 100107823, Sep. 30, 2013, 8 pp.
Japanese Office Action, JP 2011245369, Issued May 28, 2013, 5 pp.
Office Action issued in corresponding Taiwanese Patent Application No. 10320465470 on Apr. 8, 2014, consisting of 8 pp.
Office Action issued in corresponding Korean Patent Application No. 201110122196.8 dated Dec. 4, 2013.

* cited by examiner

*Primary Examiner* — Calvin Choi
(74) *Attorney, Agent, or Firm* — Volpe and Koenig, P.C.

(57) ABSTRACT

The present invention related to a method for manufacturing a semiconductor, comprising steps of: providing a growing substrate; forming a semiconductor substrate on the growing substrate; forming a first structure with plural grooves and between the growing substrate and the semiconductor substrate; and changing the temperature of the growing substrate and the semiconductor substrate.

16 Claims, 4 Drawing Sheets

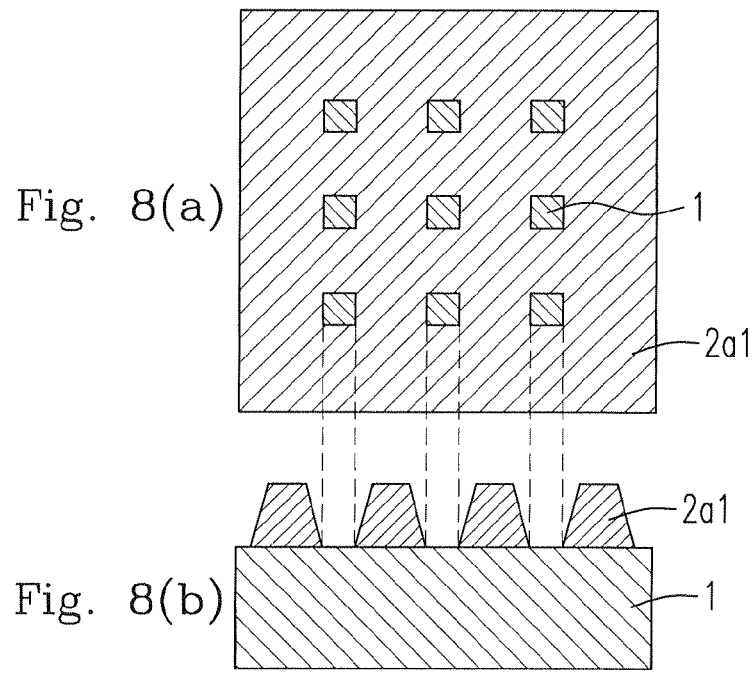
Fig. 8(a)
Fig. 8(b)
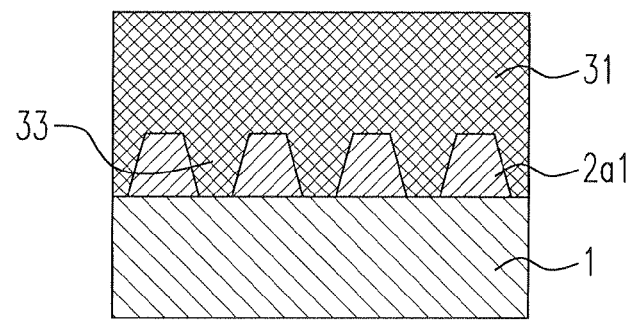
Fig. 9
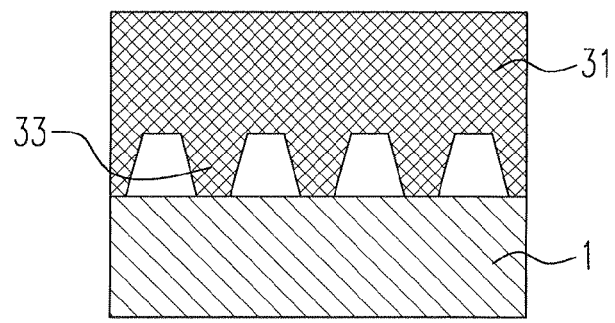
Fig. 10

METHOD OF SEMICONDUCTOR MANUFACTURING PROCESS

FIELD OF THE INVENTION

The present invention relates to a semiconductor manufacturing process, and more particularly to a lift-off method in a semiconductor manufacturing process.

BACKGROUND OF THE INVENTION

In the conventional process of the light-emitting diode (LED), a sapphire ($AL_2O_3$) substrate, whose crystal structure is similar to that of Gallium Nitride (GaN), is generally chosen to be a growing substrate. However, the sapphire substrate has the worse electrical conductivity and thermal conductivity, and thus, the GaN LED has the defect that thermal dissipation is poor, the reliability of LED is bad, and the emitting area and efficiency of the LED chip are affected under high-current, high-power and long-time operations. Therefore, the manufacture of LEDs and the raising for the emitting efficiency are hindered.

In order to improve the above-mentioned defects, a conventional method is to remove the sapphire substrate. In the prior art, the nitride semiconductor elements are shifted from the sapphire growing substrate to a bonding substrate by a wafer bonding technique so as to raise the characteristics of the LEDs. Namely, the GaN epitaxial layer is lifted off from the sapphire substrate, and is shifted to a substrate with high electric conductivity and high thermal conductivity. In the above-mentioned process, the laser lift-off technique is usually applied to remove the sapphire growing substrate. However, the laser lift off technique degrades the characteristics of the LED elements and affects the yield thereof. Besides, the laser lift-off technique is high cost. Therefore, if the nitride semiconductor elements can be lifted off from the growing substrate during the wafer bonding process without applying the laser lift-off technique, the manufacturing costs would be highly reduced.

Therefore the applicant attempts to deal with the above situation encountered in the prior art.

SUMMARY OF THE INVENTION

In view of the prior art, in the present invention, a novel process technology is provided, in which technology the contact area between the growing substrate and the nitride semiconductor substrate is reduced. In the process of the temperature change due to the heating during the wafer bonding step, since the growing substrate has the expansion coefficient different from that of the nitride semiconductor substrate, the stress become concentrated such that the growing substrate and the nitride semiconductor substrate can lift off from each other. Accordingly, the laser lift-off technique is not demanded in the processing for removing the growing substrate, and thus the cost is effectively reduced.

In accordance with the first aspect of the present invention, a method for forming a capacitor device is provided. The method includes steps of: providing a substrate; forming a first metal layer on the substrate; forming a dielectric on the first metal layer; applying a laser-annealing to the dielectric; and forming a second metal layer on the dielectric.

In accordance with the first aspect of the present invention, a method for manufacturing a semiconductor is provided. The method includes steps of: providing a growing substrate; forming a semiconductor substrate on the growing substrate; forming a first structure with plural grooves and between the growing substrate and the semiconductor substrate; and changing the temperature of the growing substrate and the semiconductor substrate.

Preferably, the changing step further comprises steps of heating the growing substrate and the semiconductor substrate, and applying a pressure to bond the semiconductor substrate to a bonding substrate.

Preferably, the bonding substrate has a material being one selected from a group consisting of a copper (Cu) material, an aluminum (Al) material, a silicon (Si) material, a diamond material, a copper alloy material and an aluminum alloy material.

Preferably, the method, before the changing step, further includes a step of forming a semiconductor element on the semiconductor substrate.

Preferably, the semiconductor substrate is a nitride semiconductor substrate, and the growing substrate has a material being one selected from a group consisting of an alumina (Al2O3) material, a sapphire material, a silicon carbide (SiC) material and a silicon (Si) material.

Preferably, the first structure is made through patterning the semiconductor substrate by one of a chemistry wet etching and a dry etching to reduce the contact area between the growing substrate and the semiconductor substrate.

Preferably, the chemistry wet etching is performed by a potassium hydroxide (KOH) solution.

Preferably, the method, before the semiconductor substrate forming step, further includes steps of: forming a dielectric layer in the growing substrate; and forming a second structure with plural grooves on the dielectric layer by an exposing, developing and etching method.

Preferably, the method, before the first structure forming step, further includes steps of: forming the semiconductor substrate on the second structure; and removing the dielectric layer to form the first structure by a wet etching.

Preferably, the wet etching is performed by a hydrogen-fluoride (HF) solution.

Preferably, the dielectric layer has a Silicon dioxide (SiO2) material.

Preferably, the second structure reveals the growing substrate and is a continuous groove structure.

In accordance with the second aspect of the present invention, a method for manufacturing a semiconductor is provided. The method includes steps of: providing a first substrate having an upper surface; providing a second substrate having a lower surface; and reducing a contact area between the upper surface and the lower surface.

Preferably, the method further includes a step of heating the first and the second substrates.

In accordance with the third aspect of the present invention, a method for manufacturing a semiconductor is provided. The method includes steps of: providing a first substrate having an upper surface; providing a second substrate having a lower surface contacting the upper surface; and heating the first and the second substrates to separate the first and the second substrates.

Preferably, the method further includes before the heating step a step of reducing a contact area between the upper surface and the lower surface.

BRIEF DESCRIPTION OF THE DRAWINGS

The foregoing and other features and advantages of the present invention will be more clearly understood through the following descriptions with reference to the drawings, wherein:

FIGS. 7-10 illustrate the structures of the second embodiment.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
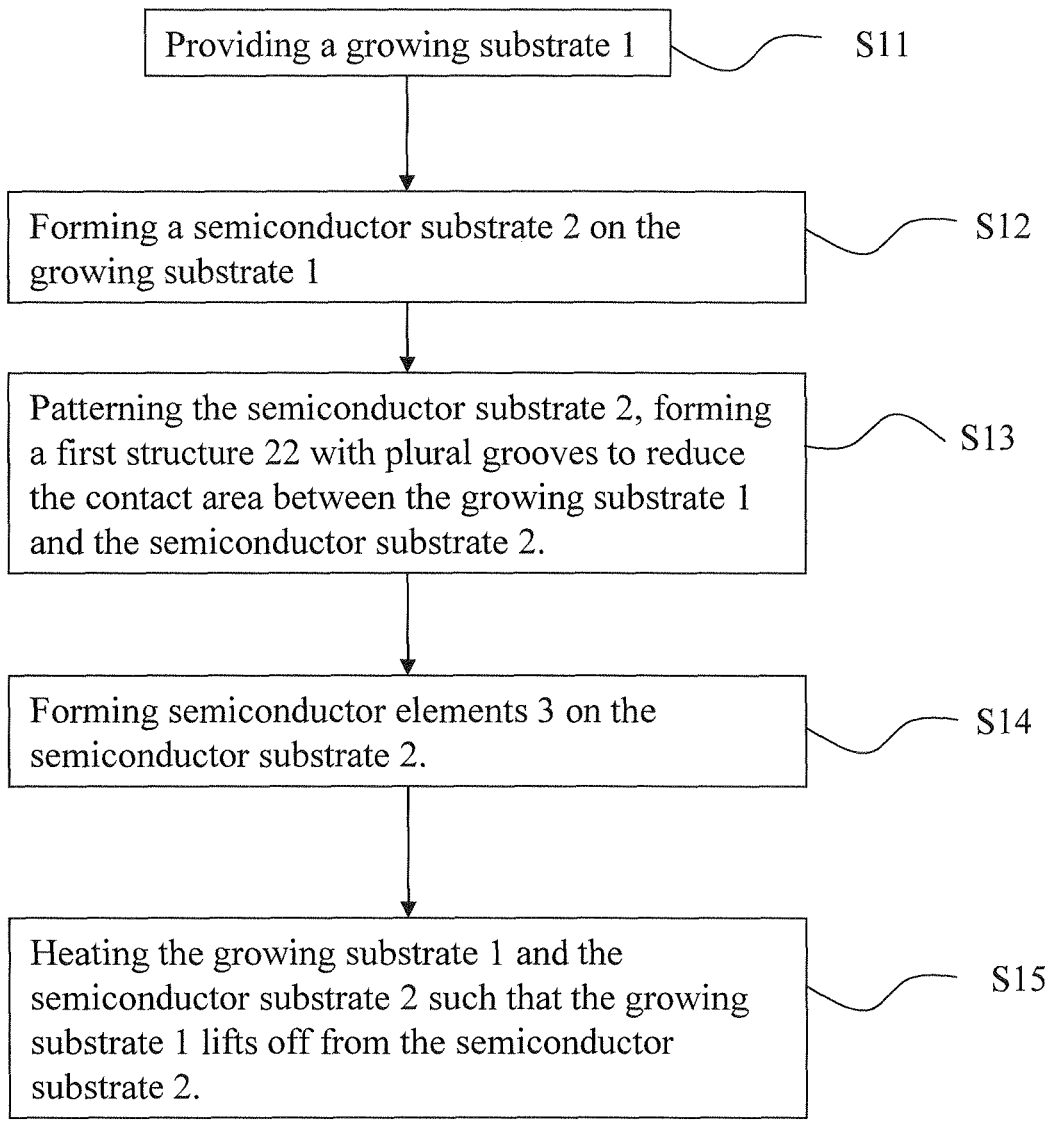
FIG. 1 is a flowchart in accordance with the first embodiment of the present application.

Please refer to FIGS. 1-5, wherein FIG. 1 is a flowchart in accordance with the first embodiment of the present application, and FIGS. 2-5 are the structures for illustrating the first embodiment of the present application. The first embodiment of the present application includes steps S11-S15, which are explained as follows.

Step S11: A first substrate, such as a growing substrate 1, is provided. The growing substrate 1 preferably has a material being one selected from a group consisting of an alumina ($Al_2O_3$) material, a sapphire material, a silicon carbide (SiC) material and a silicon (Si) material.

Figure 2:
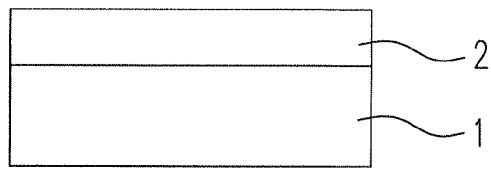
FIGS. 2-5 are the structures for illustrating the first embodiment of the present application.

Step S12: As shown in FIG. 2, a second substrate, such as a semiconductor substrate 2, is formed on the growing substrate 1. The semiconductor substrate 2 is preferably a nitride semiconductor substrate, such as Gallium Nitride (GaN). The growing substrate 1 and the semiconductor substrate 2 can be formed by conventional semiconductor processing method.

Figure 3:
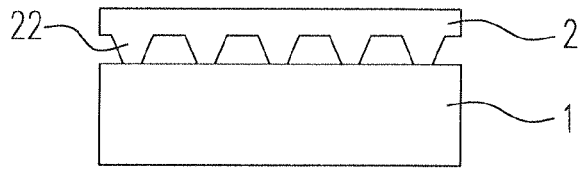

Step S13: The semiconductor substrate 2 is patterned by one of a chemistry wet etching and dry etching, and a first structure 22 with plural grooves and between the growing substrate 1 and the semiconductor substrate 2 is formed, as shown in FIG. 3, to reduce a contact area between the growing substrate 1 and the semiconductor substrate 2. It can be understood by one skilled in the art that the first structure 22 can be preferably formed through patterning the semiconductor substrate 2 by a chemistry wet etching (such as being performed by a potassium hydroxide (KOH)) solution or a dry etching.

Step S14: The subsequent element fabrication is proceeded, and semiconductor elements 3 are formed on the semiconductor substrate 2.

Figure 4:
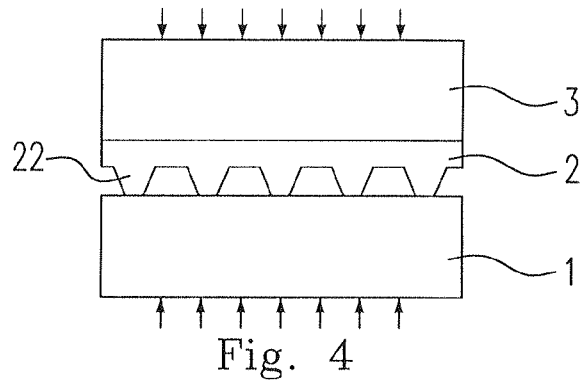

Step S15: As shown in FIG. 4, the wafer bonding is proceeded, and the temperature of the growing substrate 1 and the semiconductor substrate 2 is changed during the process of the wafer bonding. The growing substrate 1 and the semiconductor substrate 2 are heated, and receive a pressure such that the semiconductor substrate 2 bonds to the bonding substrate 4, wherein the bonding substrate preferably has a material being one selected from a group consisting of a copper (Cu) material, an aluminum (Al) material, a silicon (Si) material, a diamond material, a copper alloy material and an aluminum alloy material.

Figure 5:
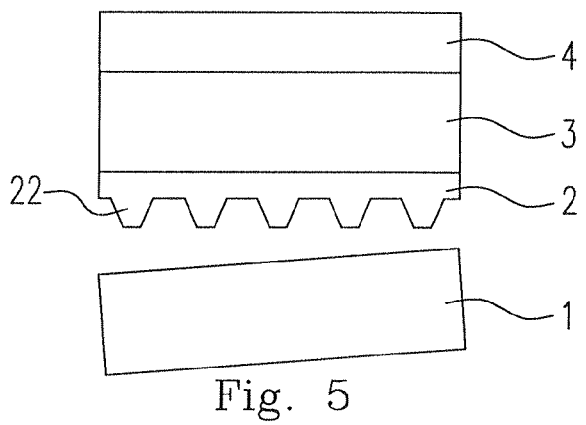

As shown in FIG. 5, the temperatures of the growing substrate 1 and the semiconductor substrate 2 are changed during the wafer bonding process. Since the expansion coefficient of the growing substrate is different from that of the nitride semiconductor substrate, the stress is concentrated such that the growing substrate 1 and the semiconductor substrate 2 lift off from each other.

It would be understood for one skilled in the art that the first structure 22 is used for reducing the contact area between the growing substrate 1 and the semiconductor substrate 2, and thus the first structure 22 can be formed in any step before the wafer bonding step and after the semiconductor 2 forming step. In addition, the first structure 22 is not limited to the regular arrangement in FIGS. 2-5, but all the structures causing the contact area between the growing substrate 1 and the semiconductor substrate 2 reduced can reach the affect of the present application.

Figure 6:
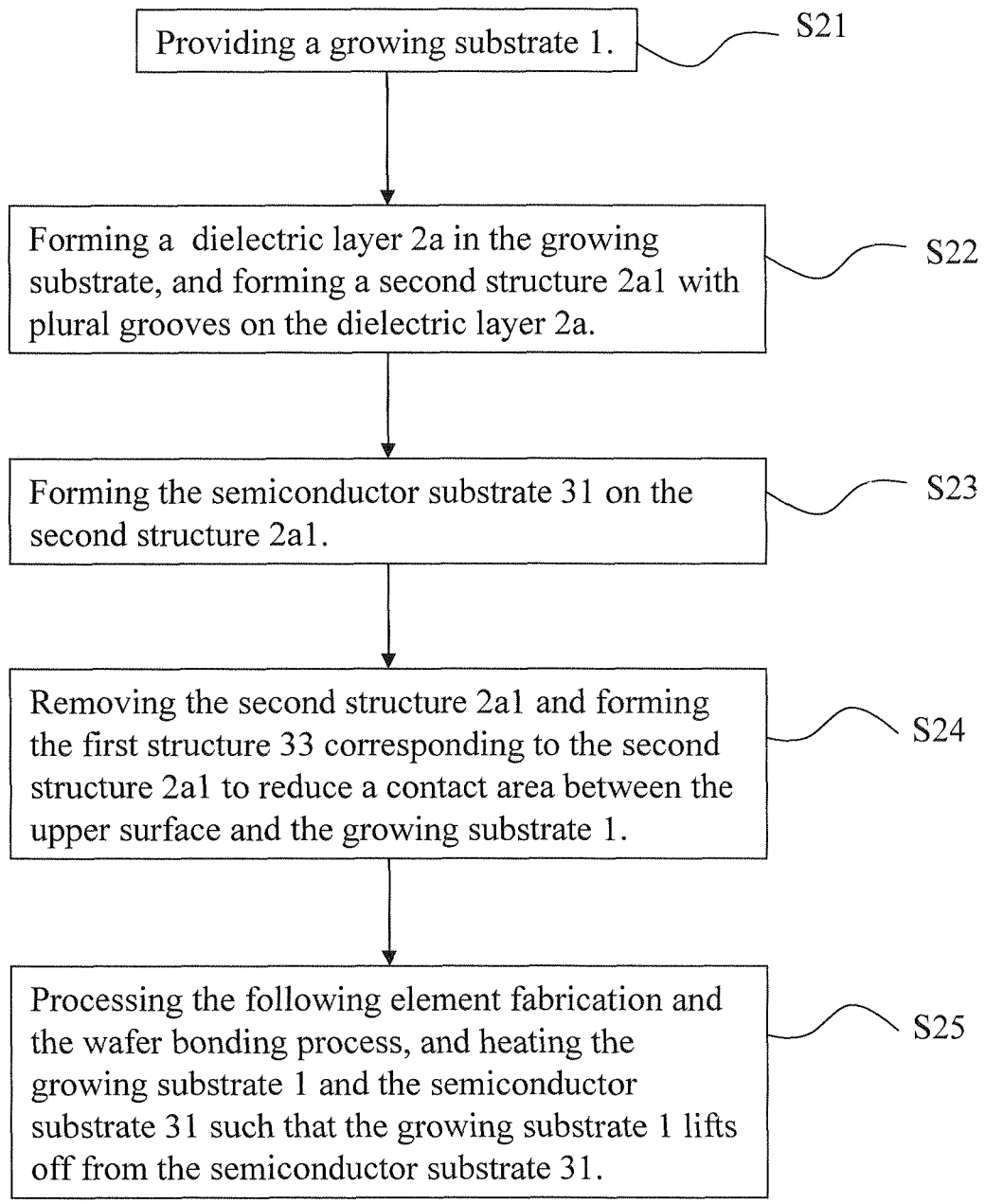
FIG. 6 is the flowchart in accordance with the second embodiment of the present application.

However, the method for forming the above mentioned first structure 22 is not limited to the flowchart provided in the first embodiment. Please refer to FIGS. 6-10, wherein FIG. 6 is the flowchart in accordance with the second embodiment of the present application, and FIGS. 7-10 illustrate the structures of the second embodiment. Similar to the first embodiment, in the second embodiment, a first structure 33 with plural grooves is formed at the place where the semiconductor substrate 31 is adjacent to the growing substrate 1 in order to reduce the contact area between the semiconductor substrate 31 and growing substrate 1. However, the method of forming the first structure 33 of the second embodiment is different from that of the first embodiment, and whose steps are as follows.

Step S21: A growing substrate 1 is provided. As illustrated in the first embodiment, the growing substrate 1 preferably has a material being one selected from a group consisting of an alumina ($Al_2O_3$) material, a sapphire material, a silicon carbide (SiC) material and a silicon (Si) material.

Figure 7:
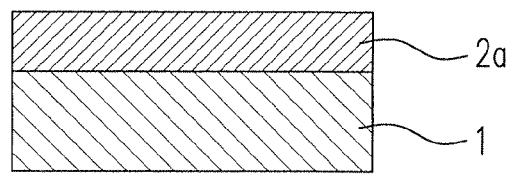

Step S22: As shown in FIG. 7, a dielectric layer 2a is formed on the growing substrate 1, and a second structure 2a1 with plural grooves is formed on the dielectric layer 2a by exposing, developing and etching method. The dielectric layer preferably has a Silicon dioxide (SiO2) material.

FIG. 8(b) shows a cross section that the second structure 2a1 has been formed on the growing substrate 1, and FIG. 8(a) is a top view corresponding to FIG. 8(b). As shown in FIGS. 8(a) and FIG. 8(b), the second structure 2a1 reveals the growing substrate 1 and is preferably a continuous groove structure.

Step S23: As shown in FIG. 9, a semiconductor substrate 31 is formed on the second structure 2a1. As illustrated in the first embodiment, the semiconductor substrate 31 is preferably a nitride semiconductor substrate, such as GaN, etc.

Step S24: The second structure 2a1 formed by the dielectric layer 2s is removed by the wet etching method, and the first structure 33 with plural grooves corresponding to the second structure 2a1 with plural grooves is formed on the lower surface of the semiconductor substrate 31. The aforementioned wet etching method is performed by a hydrogen-fluoride (HF) solution.

Step S25: After the first structure 33 with plural grooves is formed, the subsequent element fabrication and the wafer bonding process are continuously proceeded. Similar to the first embodiment, the growing substrate 1 and the semiconductor substrate 31 are heated during the wafer bonding process so that the temperatures of the growing substrate 1 and the semiconductor substrate 31 are changed. Since the expansion coefficient of the growing substrate is different from that of the nitride semiconductor substrate, the stress can be concentrated such that the growing substrate 1 lifts off from the semiconductor substrate 31.

Similar to the first embodiment, the second structure 2a1 with plural grooves in the second embodiment is not limited to the arrangement in FIGS. 8(a) and 8(b) but an arbitrary arrangement, such that the correspondingly formed first structure 33 with plural grooves is not limited to the regular arranged groove structure shown in FIG. 10. All the structures which renders the contact area between the growing substrate 1 and the semiconductor substrate 31 decreased can reach the affect of the present application.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for manufacturing a semiconductor, comprising steps in sequence of:
   providing a growing substrate having a first expansion coefficient;
   forming a semiconductor substrate having a second expansion coefficient different from the first expansion coefficient on the growing substrate;
   forming a first structure with plural grooves at a junction between the growing substrate and the semiconductor substrate;
   changing the temperature of the growing substrate and the semiconductor substrate; and
   separating the growing substrate from the semiconductor substrate by a stress concentrated on the junction based on a difference between the first and the second expansion coefficients.

2. The method as claimed in claim 1, wherein the changing step further comprises steps of heating the growing substrate and the semiconductor substrate, and applying a pressure to bond the semiconductor substrate to a bonding substrate.

3. The method as claimed in claim 2, wherein the bonding substrate has a material being one selected from a group consisting of a copper (Cu) material, an aluminum (Al) material, a silicon (Si) material, a diamond material, a copper alloy material and an aluminum alloy material.

4. The method as claimed in claim 1, before the changing step, further comprising a step of forming a semiconductor element on the semiconductor substrate.

5. The method as claimed in claim 1, wherein the semiconductor substrate is a nitride semiconductor substrate, and the growing substrate has a material being one selected from a group consisting of an alumina ($Al_2O_3$) material, a sapphire material, a silicon carbide (SiC) material and a silicon (Si) material.

6. The method as claimed in claim 1, wherein the first structure is made through patterning the semiconductor substrate by one of a chemistry wet etching and a dry etching to reduce the contact area between the growing substrate and the semiconductor substrate.

7. The method as claimed in claim 6, wherein the chemistry wet etching is performed by a potassium hydroxide (KOH) solution.

8. The method as claimed in claim 1, before the semiconductor substrate forming step, further comprising steps of:
   forming a dielectric layer in the growing substrate; and
   forming a second structure with plural grooves on the dielectric layer by an exposing, developing and etching method.

9. The method as claimed in claim 8, before the first structure forming step, further comprising steps of:
   forming the semiconductor substrate on the second structure; and
   removing the dielectric layer to form the first structure by a wet etching.

10. The method as claimed in claim 9, wherein the wet etching is performed by a hydrogen-fluoride (HF) solution.

11. The method as claimed in claim 8, wherein the dielectric layer has a Silicon dioxide ($SiO_2$) material.

12. The method as claimed in claim 8, wherein the second structure reveals the growing substrate and is a continuous groove structure.

13. A method for manufacturing a semiconductor, comprising steps in sequence of:
    providing a first substrate having a first expansion coefficient and an upper surface;
    providing a second substrate having a second expansion coefficient different from the first expansion coefficient and a lower surface;
    reducing a contact area between the upper surface and the lower surface;
    changing the temperature of the first substrate and the second substrate; and
    separating the first substrate from the second substrate by a stress concentrated on the contact area based on a difference between the first and the second expansion coefficients.

14. The method as claimed in claim 13 further comprising a step of heating the first and the second substrates.

15. A method for manufacturing a semiconductor, comprising steps in sequence of:
    providing a first substrate having a first expansion coefficient and an upper surface;
    providing a second substrate having a second expansion coefficient different from the first expansion coefficient and a lower surface contacting the upper surface at a contact area; and
    concentrating a stress on the contact area based on a difference between the first and the second expansion coefficients by heating the first and the second substrates, to separate the first and the second substrates.

16. The method as claimed in claim 15 further comprising before the heating step a step of reducing a contact area between the upper surface and the lower surface.

* * * * *